United States Patent
Heinz et al.

(10) Patent No.: US 6,860,977 B2
(45) Date of Patent: Mar. 1, 2005

(54) METHOD FOR MANUFACTURING A WORKPIECE USING A MAGNETRON SPUTTER SOURCE

(75) Inventors: Bernd Heinz, Sevelen (CH); Martin Dubs, Trubbach (CH); Thomas Eisenhammer, Azmoos (CH); Pius Grunenfelder, Wangs (CH); Walter Haag, Grabs (CH); Stanislav Kadlec, Buchs (CH); Siegfried Krassnitzer, Feldkirch (AT)

(73) Assignee: Unaxis Balzers Limited, Balzers (LI)

( * ) Notice: Subject to any disclaimer, the term of this patent is extended or adjusted under 35 U.S.C. 154(b) by 0 days.

(21) Appl. No.: 10/703,217

(22) Filed: Nov. 6, 2003

(65) Prior Publication Data

US 2004/0149565 A1 Aug. 5, 2004

Related U.S. Application Data

(62) Division of application No. 10/161,862, filed on Jun. 4, 2002, now Pat. No. 6,682,637.

(30) Foreign Application Priority Data

Jun. 12, 2001 (CH) .............................................. 1052/01

(51) Int. Cl.$^7$ .............................................. C23C 14/35
(52) U.S. Cl. ................................ 204/298.2; 204/298.11; 204/298.18; 204/192.12; 204/192.2

(58) Field of Search .......................... 204/192.12, 192.2, 204/298.11, 298.16, 298.17, 298.18, 298.2

(56) References Cited

U.S. PATENT DOCUMENTS

| | | | |
|---|---|---|---|
| 5,262,028 A | 11/1993 | Manley | |
| 5,284,564 A | 2/1994 | Maass | |
| 5,688,381 A | 11/1997 | Grunenfelder | |
| 6,352,629 B1 | * 3/2002 | Wang | ...................... 204/298.2 |

FOREIGN PATENT DOCUMENTS

EP          0 393 957         10/1990

* cited by examiner

*Primary Examiner*—Rodney G. McDonald
(74) *Attorney, Agent, or Firm*—Notaro & Michalos P.C.

(57) ABSTRACT

A workpiece is manufactured using a magnetron source that has an optimized yield of sputtered-off material as well as service life of the target. Good distribution values of the layer on the workpiece are obtained that are stable over the entire target service life, and a concave sputter face in a configuration with small target-to-workpiece distance is combined with a magnet system to form the magnetron electron trap in which the outer pole of the magnetron electron trap is stationary and an eccentrically disposed inner pole with a second outer pole part is rotatable about the central source axis.

17 Claims, 4 Drawing Sheets

METHOD FOR MANUFACTURING A WORKPIECE USING A MAGNETRON SPUTTER SOURCE

CROSS-REFERENCE TO RELATED APPLICATION

This is a divisional of application Ser. No. 10/161,862 filed Jun. 4, 2002 and now U.S. Pat. No. 6,682,637.

FIELD AND BACKGROUND OF THE INVENTION

The invention relates to a method for manufacturing a workpiece using magnetron sputter source.

Magnetron sputter sources of this type have been known for many years and serve for coating substrates in a vacuum. Such magnetron sputter sources are distinguished in that with the aid of a magnetic field a dense plasma is generated in front of the target surface to be sputtered, which permits sputtering the target through ion bombardment at high rates and attaining a layer on the substrate with high growth rate. In such magnetron sputter sources the magnetic field serves as an electron trap which determines significantly the discharge conditions of the gas discharge and plasma confinement. The magnetic field of such a magnetron electron trap is developed such that in the region of the back side of a target to be sputtered closed magnetic pole loops are disposed which do not intersect and, in special cases, form an annular configuration and can also be disposed concentrically, with these magnetic pole loops being disposed antipolar-wise and spaced apart such that field lines close between the poles and herein at least partially penetrate the target where they determine the electron trap effect in the region of the sputter faces. Due to the pole loops disposed one within the other or concentrically, in the target surface region a magnetic field is developed in the form of a tunnel, which forms a closed loop in which the electrons are captured and guided. Based on this characteristic structuring of the magnetron electron trap, an annular plasma discharge is also generated with inhomogeneous plasma density distribution which results in the target likewise being eroded nonuniformly through the nonuniform ion bombardment. In such a magnetron discharge typically an annular erosion trench is generated during operation whereby also problems in the layer thickness distribution on the substrate result and have to be solved. A further disadvantage is that through the developing trench-form erosion pattern of the target the utilization of the target material becomes reduced.

These problems have already been recognized according to DE OS 27 07 144 corresponding to U.S. Pat. No. 5,284,564. The solution proposed is to generate between the loop-form plasma discharge and the target a relative movement such that the plasma sweeps over the target surface. Thereby the erosion profile on the target is to be broadened or flattened and simultaneously the layer distribution on the substrate disposed in front of it to be improved. In the case of rectangular magnetron sputter configurations the magnet system which generates the electron trap is moved, for example according to FIG. 1, back and forth behind the flat target. In the case of round sputter sources, the magnet systems according to FIGS. 22 to 25 is, for example, rotated behind the target about the target axis. Thereby is attained that the plasma loop sweeps over the round target plate. FIGS. 22 and 25 show in addition that the electron trap loop can be shaped differently and can thereby affect the resulting erosion profile.

In configurations in which the substrates are disposed stationarily opposite the magnetron target or rotate about their internal axes in a plane in front of the target, or in which already in the substrate plane over a maximally large area high homogeneity requirements of the coating must be met, special problems are encountered since the distribution and the material utilization problematic must primarily be solved already at the source side and cannot be solved by moving the substrate past such source. Coating installations of this type, in which disk-form substrates are transferred in cycles and positioned in front of a magnetron sputter source and coated there, have greatly gained in significance. In this way today preferably semiconductor wafers are worked or coated for the production of electronic structural components, as well as storage disks for the production of magnetic storage plates and for the production of optical and optomagnetic storage plates.

For coating stationarily disposed disk-form substrates first annular sputter sources were already used before 1980. As stated, through the annular plasma loop a pronounced annular erosion trench is developed in the target, which leads to problems with the layer distribution on the substrate at high precision requirements. Therefore in the case of such source configurations the distance between target and the substrate to be coated must be relatively large, typically must be in the range from 60 to 100 mm. In order to attain good distribution values, in addition the target diameter must be selected to be somewhat greater than the substrate diameter. The relatively large target substrate distance as well as also the relatively large oversizing of the target diameter practically led to the fact that the utilization of the material sputtered off was overall poor. Due to the low economy following as a consequence and the ever increasing distribution requirements made of the coating, round magnetron source configurations with rotating magnet systems were developed, which make possible further improvements in this respect. In order to increase the material utilization and the coating rate it was found that the target substrate distance and the target diameter had to be decreased. But this is only possible if, for one, the plasma confinement takes place such that the plasma extension does not disturb the substrate to be coated and, for another, the target removal is homogeneous over the surface and in particular also in the proximity of the target center is sputtered off.

Figure 1A:
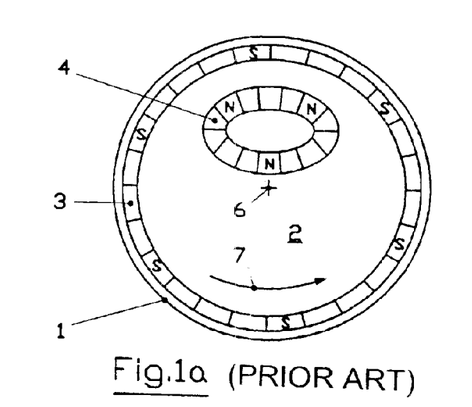
FIG. 1a is a top plan view of a rotatable round magnet system configuration with outer pole and with inner pole disposed eccentrically to the central axis according to prior art.
Figure 1B:
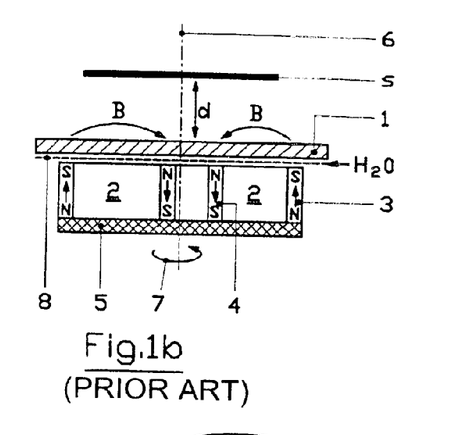
FIG. 1b is a schematic cross sectional view of the magnet system configuration according to FIG. 1a with target and substrate configuration according to prior art.

A first improvement step could be achieved according to a configuration such as is depicted in FIG. 1a. The magnet system 2 is comprised of an outer annular magnet pole 3 and an inner eccentrically offset counter pole 4. The magnet system 2 is supported rotatably about a central rotation axis 6 and is rotated in the rotational direction 7 by a drive, such as with an electromotor, with respect to the stationary target. Due to the eccentric configuration of the inner pole 4, upon application of a discharge voltage on the target 1 an eccentrically rotating plasma loop is generated, which sweeps over a major portion of the target. In FIG. 1b this configuration is shown in cross section, wherein the magnet system 2 is rotatably supported about the source center axis 6 in the rotational direction 7, a substrate s is disposed at a distance d (typically in the range from 40 to 60 mm) from the round target plate 1, with the target 1 being, for example, water-cooled via a cooling device 8. The magnet system 2 is formed of permanent magnets 3, 4 and these are disposed such that the outer pole 3 and the inner pole 4 are spaced apart and antipolar such that the generated field lines B penetrate through the target 1 and form across the target surface the closed tunnel-form magnetic field loop, which forms an electron trap. The return of the permanent magnets takes place across a yoke plate 5 of highly permeable material, such as iron, which is disposed on that side of the permanent magnet poles which is further removed from target 1. To generate an eccentricity of the plasma loop, the inner pole 4 was offset with respect to the rotation axis 6. By choosing this eccentricity the erosion and distribution characteristic can be optimized in a certain range.

Figure 1C:
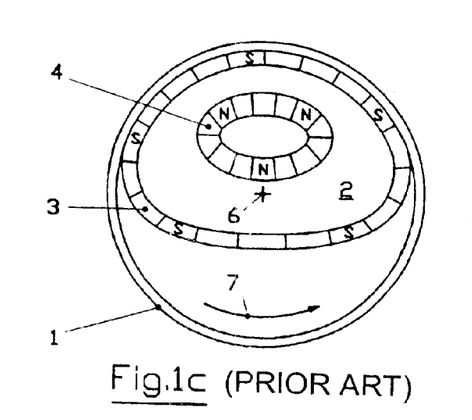
FIG. 1c is a top plan view of a further rotatable magnet system configuration with the magnet system disposed eccentrically to the rotation axis according to prior art.
Figure 1D:
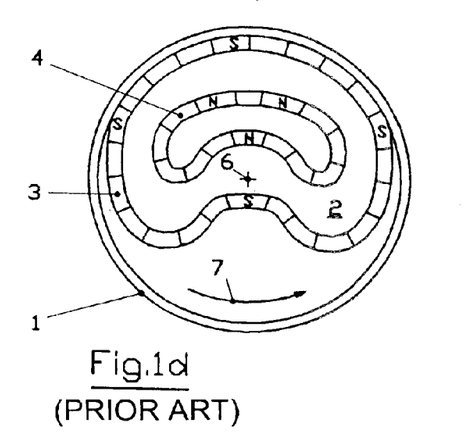
FIG. 1d is a top plan view of a further implementation of a rotatable eccentrically disposed magnet system with magnet configuration similar to a cardioid.

A further significant improvement of the magnet system configuration is possible through the completely eccentric formation of the magnetic circuit according to FIGS. 1c and 1d. The width, depicted in FIG. 1c and substantially uniform, of the magnetic tunnel along the entire closed loop permits a more constant and efficient electron trap effect and especially a clearer definition of the eccentricity of the plasma loop, which leads to better results. In FIG. 1d a further embodiment is shown, in which the plasma loop is folded into itself again for example in the form of a type of cardioid curve. Depending on the magnitude of the target and substrate dimensions, a large number of possible loop forms result, such as for example also folded plasma loops, which serve for optimization of the sputter and distribution conditions on the substrate. The advantage of these rotating configurations lies not least therein that the results can be well calculated in advance via the geometric formation alone. Further simulation calculations are possible for the optimization of the design.

Magnetron sputter sources with round planar target and with rotating magnet systems have been marketed for many years by Balzers Aktiengesellschaft in Liechtenstein, for example under the type designation ARQ 125, and are also described in the operating instructions (BB 800 463 BD) for the source in the first edition May 1985.

Figure 2:
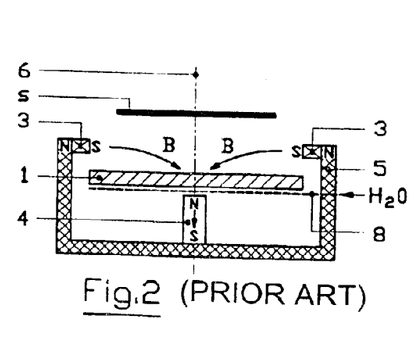
FIG. 2 is a schematic cross sectional view of a magnetron configuration with an outer pole elevated with respect to the inner pole for stationarily disposed substrate planes according to prior art.

A further option for affecting the erosion profile comprises shifting the outer magnet pole in the direction of the target sputter face, parallel to the source axis 6, as is shown in FIG. 2. Thereby the field line course B is changed, in particular flattened, such that the erosion profile can be broadened. In such configurations with magnet poles elevated it is also possible to elevate the inner pole 4 in the center if necessary also over the sputter face of the target 1 if the target in the center has an opening provided for this purpose and the provided sputter characteristic permits such. In a stationary coating configuration of substrate s this source formation has the disadvantage that, on the one hand, relatively large target to substrate distances are necessary, the utilization of the sputtered material which arrives on the substrate s is relatively low, since the zones in the outer region, which cannot be utilized, are proportionally large and the target utilization is lower than in rotating systems.

Figure 3:
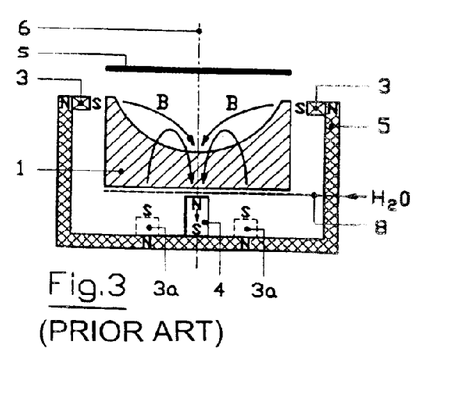
FIG. 3 is a schematic cross sectional view of a further configuration with an outer pole elevated with respect to the inner pole and concavely developed target according to prior art.

A further and significantly improved formation of a magnetron sputter source configuration for coating disk-form substrates s is depicted in FIG. 3 and described in EP 0 676 791 B1 corresponding to U.S. Pat. No. 5,688,381. This source configuration also has elevated outer poles 3, wherein the pole region itself is preferably developed as a permanent magnet and the magnetic return with respect to the central inner pole 4 takes place across an iron yoke 5. In this source the target body 1 is developed such that it is arched inwardly, thus is concave, and the electron trap is defined such that the hollow volume generated by the inward arching of target 1 forms substantially the plasma discharge volume. It becomes hereby possible to move with the substrate s very close to the target 1, for example 35 mm at a substrate diameter of 120 mm, with the target diameter not being substantially larger than the substrate diameter. Hereby the discharge volume between the concavely developed target 1 and the substrate is substantially delimited by the substrate and the sputter face. This results in the sputtered material being transferred to a very large extent onto the substrate and the margin losses being low. With this source configuration therefore high coating rates at very good economy are possible. Certain restrictions however occur thereby that the control of the erosion profile and of the distribution and the attainment of reproducible conditions, in particular over the target service life, is difficult in this respect. Attempts have therefore been made to affect with additional outer pole configurations 3a, which are disposed between the inner pole 4 and the outer pole 3, the plasma discharge such that at deepened erosion profile a shift of the plasma ring takes place in order to attain a specific compensation effect. At very high required distribution requirements and material utilization degrees this method has, however, certain restrictions.

SUMMARY OF THE INVENTION

The present invention therefore has as its object to eliminate the disadvantages of prior art. In particular, the present invention has as its object to realize a magnetron sputter source with elevated outer pole magnet configuration, which combines the advantages of high sputter rates at high degrees of material utilization with very good achievable distribution values on the substrate during the entire target service life, at stable and reproducible conditions. In addition, the magnetron sputter source has high overall economy.

Building on a magnetron sputter source of the above cited type this object is attained through its formation according to the claims.

According to the invention the annular outer pole does not lie in the same plane as the inner pole and, in the margin region of the round target body, is elevated with respect to the inner pole and the rotatable magnet system part receives an inner pole disposed eccentrically to the source axis and receives a second outer pole part between inner pole and static outer pole such that with rotation the tunnel loop of the magnetic field eccentrically sweeps over the sputter face, at high rate and material utilization a good and stable distribution results over the entire target service life which leads to a significant increase of economy. Preferred applications are obtained according to the invention.

BRIEF DESCRIPTION OF THE DRAWINGS

FIGS. 1 to 3 reproduce, schematically, the prior art and FIGS. 4 to 8 reproduce by example and schematically the configuration according to the invention.

In the figures:

DESCRIPTION OF THE PREFERRED EMBODIMENTS

Figure 5:
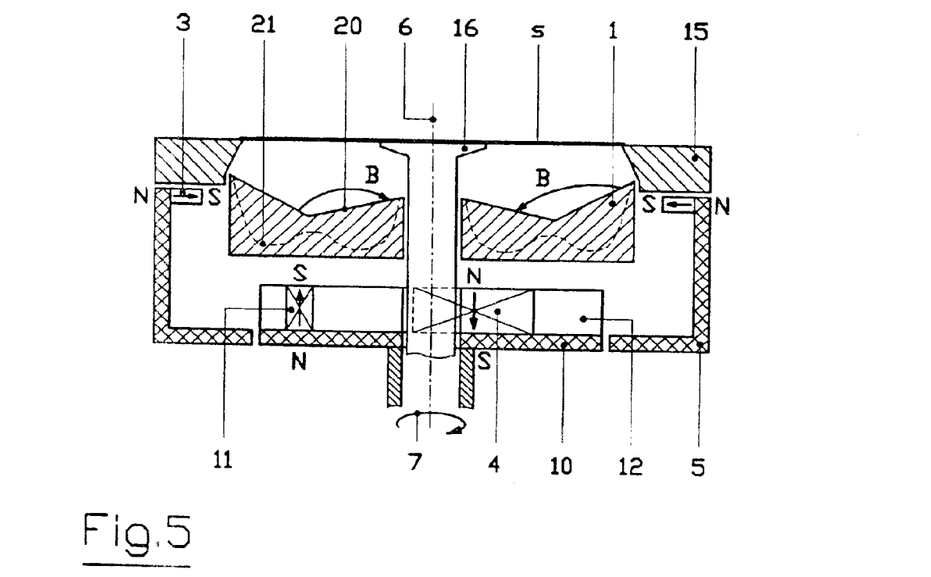
FIG. 5 is a cross sectional view of a configuration according to the invention and according to FIG. 4.

FIG. 5 depicts a magnetron sputter source in cross section and schematically. The sputter target 1 is developed as an annular target body, which has substantially a concavely developed sputter face 20. The sputter face 20 can per se also be developed such that it is planar, but the concave development is significantly more advantageous since with small substrate distance d the discharge volume comprises essentially the sputter face 20 and the substrate face s and thus the loss zone in the margin region is minimal. The round target 1 for coating storage plates s is advantageously developed such that it is annular which permits guiding an electrode 16 through in the center along the source center axis, which serves simultaneously as center mask for the disk-form substrate s. The substrate s is disposed at a small distance d from target 1 and the diameter of target 1 is only slightly greater than the diameter of substrate s. The discharge volume formed thereby is delimited by an electrode 15 encompassing this volume. Due to this formation, the residual surfaces 15 and 16, which are also coated, are minimized relative to the usable surface of the substrate s and the so-called material transfer factor is thereby increased. The electrodes 15 and 16 are conventionally with DC current operation switched anodically and the target 1 cathodically. But, in known manner, such electrodes can also be operated floating or at a bias. The magnet system comprises an encompassing outer pole 3 elevated in the margin region of target 1 and an inner pole 4, eccentrically disposed to the source axis 6 behind target 1, wherein between the inner pole 4 and the outer pole 3 a second outer pole part 11 is disposed, which assumes a partial function of the outer pole 3. The second outer pole part 11 is, for example, developed as a segment-like part which represents a type of cutout from the annular outer pole 3 but is disposed offset and rotatable. The poles directed toward target 1 are defined such that the inner pole 4 represents a counter pole to the outer pole 3 and to the outer pole part 11 such that the already described tunnel-form magnetic fields B are generated across the sputter face 20, which forms an annular closed loop for the plasma confinement. The poles 3, 4 and 11 are developed with advantage directly from permanent magnet material, wherein preferably permanent magnet material of the types rare earths is employed such as cobalt, samarium and in particular of the type neodymium. For the magnetic return in the back side region of the permanent magnets in known manner iron yokes 5, 10 are employed. The output pole 3 is according to the invention disposed stationarily along the target periphery encompassing the latter and parallel to the central axis 6 elevated with respect to the inner pole 4 and the second outer pole part 11 on the target margin. By the degree of elevation of the outer pole 3 with respect to the inner pole 4 within certain limits the erosion profile 21, which is generated through the sputter process on target 1, can be affected and optimized. But the outer pole 3 should advantageously not be shifted beyond the target margin in the axial direction 6. The eccentrically disposed inner pole 4 and the outer pole part 11, also disposed eccentrically, are mounted on a second return yoke 10 rotatable about axis 6 and supported such that between the first return yoke 5, which encompasses the second return joke 10, a small air gap is formed such that the inner pole magnets 4 and the magnets 11 of the outer pole part 11 with the second yoke 10 can rotate freely about axis 6. The second yoke 10 is advantageously developed as a round plate, which can receive the magnets 4, 11 in a magnet casing 12. In spite of stationary magnet system part 3, 5, through the rotation of the magnet system part 4, 10, 11 is achieved that the tunnel-form magnet field loop B, and thus the generated plasma ring discharge, can be moved eccentrically with respect to axis 6 and thereby the plasma sweeps over the sputter face 20 in the desired manner. The generated erosion profile 21 can hereby be predetermined and affected in the desired manner.

Figure 4:
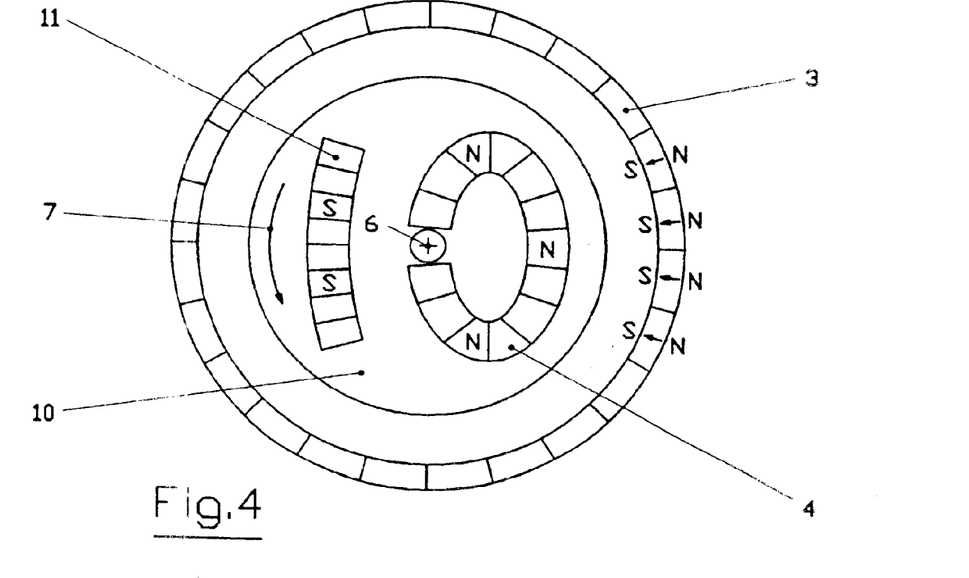
FIG. 4 is a schematic top plan view of a magnet system configuration according to the invention with stationary outer pole and rotatable eccentrically disposed inner pole and outer pole part, with the stationary outer pole 3 being elevated with respect to the inner pole on the target margin.

The source according to the invention corresponding to FIG. 5 is depicted in top view to illustrate the exemplary magnet configuration in FIG. 4. On the return yoke 10, which, as a rule, comprises iron are eccentrically mounted magnets 4 which represent the inner pole, with the inner pole 4 being disposed eccentrically such that it extends with advantage just into the proximity of the center axis 6. The second outer pole part 11, which is developed in the form of segments, also comprises permanent magnets and is disposed on the round plate-form yoke spaced apart with respect to the inner pole 4 such that the magnetic field lines close across poles 11 and 4 and in the region, in which no second outer pole part 11 is adjacent with respect to the inner pole 4, the field lines close across the inner pole 4 and the outer pole 3. The magnet system part mounted on the rotatable yoke plate 10 rotates in rotational direction 7 about the central source axis, with the outer pole 3 remaining stationary. The thereby developed eccentrically disposed magnetron electron trap thus rotates about axis 6 and thus also does the plasma loop.

The target-substrate distance to the lowest site of the concave target 1 is advantageously smaller than 60 mm and values of less than 40 mm yield very good conditions with respect to material utilization and distribution and values of less than 35 mm mean still better transfer factors at typical substrate disk diameters of 120 mm. In order to be able to ensure a stable plasma discharge, distances below 20 mm can no longer be recommended. The target diameter should herein be up to 30% greater than the substrate diameter but preferably not greater than by 25%. The source is advantageously suitable for disk-form substrates, in particular with a diameter of 50 to 150 mm, wherein for those in the range of 70 to 150 mm the configuration is especially suitable and in which lie the typical dimensions for storage plates.

Figure 6:
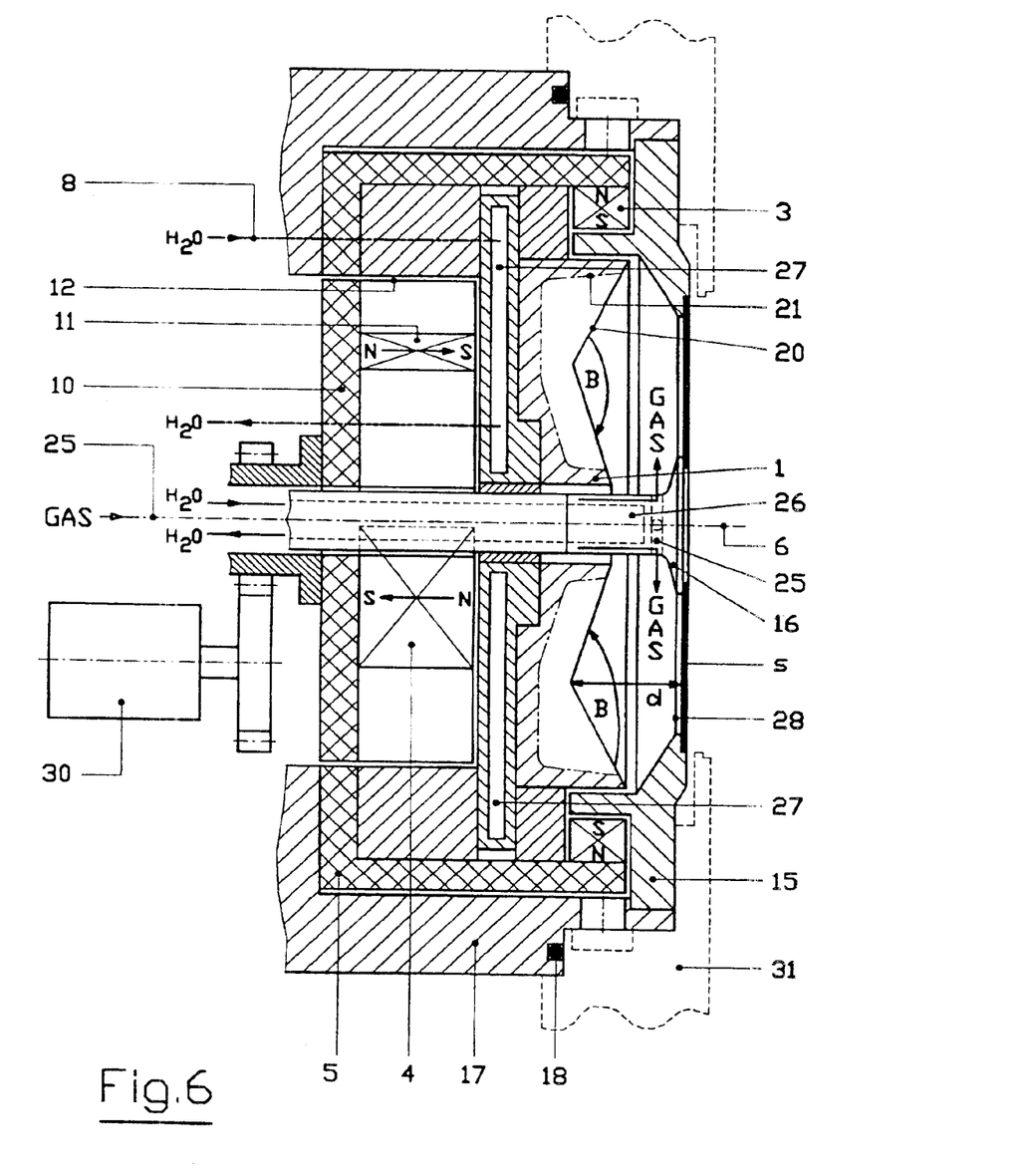
FIG. 6 is a cross sectional view of a further example according to the invention shown in detail and schematically.

A practical and preferred embodiment example of the source according to the invention is depicted in detail and schematically in cross section in FIG. 6. The sputter target 1 is preferably developed as an annular body with an opening in the center. The annular body is advantageously concave in the region of the sputter face 20, developed channel-form and especially advantageously has substantially the form of a V. The outer margin of target 1 is disposed somewhat higher than the inner margin. The lowest point of the channels, or of the V-form sputter face 20, is disposed with respect to the sputter axis 6 approximately at one half the target radius Rt. The target is cooled in the conventional manner with cooling means on the back side, for example with a cooling plate 27 through which flows cooling water. On the sputter-face side periphery of target 1 is disposed an annular diaphragm 15, which is switched as counter electrode to target 1. In the present example the anode 15 is electrically connected to installation potential or to ground potential. The anode 15 comprises a receiving opening 28, into which the disk-form substrate s is placed. The configuration is developed such that with respect to the lowest point of the sputter face 20 and the substrate a distance d of 20 to 60 mm is generated, preferably in the range from 20 to 40 mm. This configuration overall forms the plasma volume, and it must be ensured that the area of electrode 15 not utilizable for the coating remains small. The opening 28 herein has for example a diameter of approximately 120 mm in order to be able to receive corresponding substrates s. To attain even better distribution values, substrates s can in the region of opening 28 additionally be also rotated about their axis 6 or even be disposed rotatable and slightly offset eccentrically with respect to axis 6. It is also possible to position more than one substrate in plane 28. Further, by inclining the substrate plane with respect to the vertical plane through the source axis 6, a further setting parameter can be introduced, if especially difficult distribution requirements make such necessary. For optical storage plates which have an opening in the center, a central mask 16 is required, which simultaneously acts as mounting and as additional anode. The center mask 16 is guided through an opening of target 1 in the center and is advantageously cooled via a cooling means inlet 26. In addition, via this center mask 16 the discharge gas 25 can be supplied. The center mask is guided in its extension through the cooling plate 27 and the rotatable magnet system part 4, 10, 11, 12 along axis 6. The center mask 16 can also be operated such that it is electrically floating and in this case only the electrode 15, which encompasses the substrate S, is switched anodically.

Figure 8:
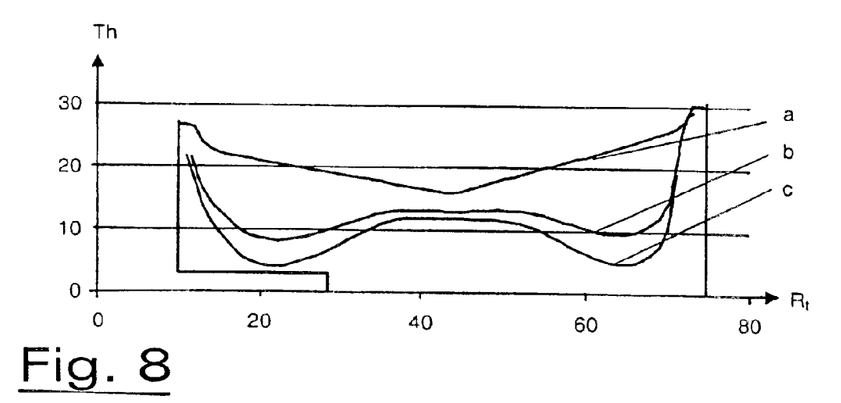
FIG. 8 is the cross sectional profile of one half of a target as an example of the erosion which can be attained according to the invention over the target service life.

The inner pole 4 disposed eccentrically with respect to the rotation axis 6 and the second outer pole part comprise rare earth magnets and are mounted on the second iron yoke 10, which is developed as a round carrier plate, wherein the entire magnet system part is closed with a casing cover 12. This rotatable magnet system part is driven via a driving arrangement 30, for example an electromotor with gearing. The outer and stationarily disposed yoke 5, which is magnetically coupled with the rotatable yoke 10 is elevated along the periphery of target 1 and in the end region carries outer pole magnets 3, which form the poles such that over the sputter face 20 a tunnel-form magnetic field B with a closed loop is generated. Through the rotation of the magnet system part 4, 10, 11 the magnetic field loop is moved over the sputter face 20 eccentrically about the central axis 6, whereby the desired erosion characteristic is generated. The outer pole 3 advantageously does not extend beyond the periphery of target 1 in the direction of the substrate plane s. Additional measures for protecting the magnets 3 and to prevent parasitic discharges in undesirable regions in the pole proximity are possible thereby that labyrinth-like and dark-space umbrella-like coverings between target periphery and outer pole 3 are provided. This can, as shown in the depicted example, be combined with corresponding formation of the outer anode 15. The entire source can in conventional manner be installed into a vacuum-tight casing 17, which via a vacuum seal 18 is flanged to a vacuum installation 31. A realized magnetron sputter source depicted by example has the following dimensions:

target diameter: 150 mm target thickness: 30 mm target form: essentially V-form according to FIG. 8 where Th denotes the target thickness and Rt defines the target radius in mm and a the sputter original face 20 target material: silver, or silver alloy target utilization: >45% transfer factor of the target material: >45% layer thickness distribution: approximately 5% target substrate distance: d=30 mm sputter gas and pressure: Ar, approximately $10^{-3}$ millibar number of CDR coatings: >110,000/target substrate diameter: 120 mm (CDR)

layer thickness on substrate: approximately 700 Å.

Figure 7:
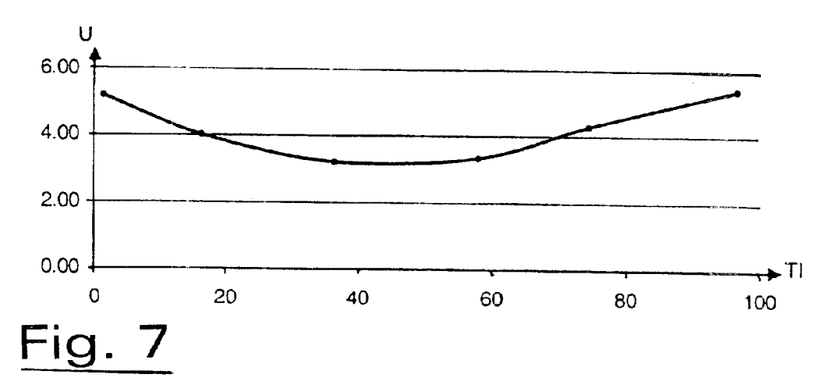
FIG. 7 is an example of a measured curve of the average distribution on a substrate over the target service life.

It was found that with the present invention primarily over the entire target service life with more than 110,000 coated storage plates a layer thickness precision over the useful area of the storage plate of approximately 5% could be maintained. This result is shown in FIG. 7. The distribution U in percent over the target service life, relative to the number T1 of coated substrates s given in units of thousands, has a highly uniform and constant course in the range of approximately 3.5 to 5% distribution accuracy. A further advantage of the configuration comprises that the target material is better utilized, wherewith, on the one hand, a relatively large number of coatings T1 is possible before the target 1 must be replaced and, on the other hand, material can be saved, which leads overall to greater economy. A highly significant aspect herein is moreover that over the service life TL of target 1 not only the distribution proportions U remain constant but also the discharge conditions. This is primarily attained through the uniform and specific erosion characteristic of the source over the target service life, as is shown in FIG. 8 in conjunction with an example.

In FIG. 8 is depicted a cross section through one half of an annular target with V-form sputter original face 20 with profile curve a and with two erosion profile curves b and c after different operating times. Profile b shows a formation after approximately ⅔ of the target service life and profile c approximately at the end of the target service life. It is immediately evident that the profiles are highly uniform and hardly differ in form and extend essentially symmetrically. This also causes the plasma conditions to remain constant and reproducible, even over relatively steep erosion paths Th of target 1.

For storage plate applications of said type with diameters in the range from 50 to 150 mm an annular target developed concavely is suitable, which means disposed annularly about axis 6 has preferably a type of V-form profile. Herein the inclination of the inner face with respect to a planar face is to be selected of advantage in the range from 5 to 30 degrees, preferably in the range from 10 to 20 degrees, with the inclination of the outer face to be selected in the range from 12 to 30 degrees, preferably in the range from 15 to 25 degrees in order to attain good results. The lowest point of the concave target lies herein approximately in the central radius region of target 1, preferably in the range of the 0.4- to the 0.7-fold of the target radius.

The sputter source according to the invention is per se suitable to sputter all known materials. The source is preferably applicable for sputtering metals or metal alloys. Reactive processes in which, in addition to argon, also an additional reactive gas, such as for example oxygen or nitrogen, are employed, are also possible, Apart from a pure DC sputtering process, also high frequency, medium frequency or DC and AC superimposed processes are possible, but in particular also the operation with pulsed or modulated feed. The source is in particular suitable for sputtering metals and/or their alloys in DC, or DC-pulsed operation. Due to the high target utilization and the good degree of material utilization, high service lives of the target are achievable, which makes the source well applicable for installations in which high cycle rates are to be achieved and thus high throughputs at high economy.

Aluminum and aluminum alloys are especially often applied, preferably for optical storage such as for example CDs and DVDs (L1-layer DVD9). The previously listed advantages also have the result that precious metals can be deposited especially economically. Herein silver and its alloys are of special significance since silver with conventional sources yields rather poor degrees of utilization. In particular with optical storage plate applications such as CD-R and DVD, silver and silver alloys are of great importance and the source according to the invention represent hereto an especially economic solution. The source according to the invention is especially suitable for disk-form storage plates as well as also magnetic storage plates but in particular for optical storage such as for example for CDs, CDRs, CD-RWs and far preferred for DVDs.

The sputter source according to the invention permits combining very good layer thickness distribution with simultaneously high transfer rate and target utilization degree, long target service life and high specific deposition rate. Thereby that the target has great thickness at those sites at which the essential sputter zones are located, high target utilization of more than 40%, even more than 45%, becomes possible, wherein through the special shaping of the configuration with respect to the substrate a transfer factor of better than 45%, even better than 50%, is possible. With round target configurations especially in the outer region of the target a large material proportion is present, which also ensures through the sputter zone applied in the outer regions a high material utilization. The combination of a concave target development at low target substrate distance and small target diameters with the feasibility of eroding large target thicknesses uniformly and yet to be able to attain over the entire service life a good and stable distribution, makes possible the production in particular of storage plates in an especially economic manner. A further advantage of the source configuration according to the invention comprises that only a portion of the magnet system can be rotated leading to simpler manner of construction and, through the small outer circumference of the rotating magnet system part, denotes a significant advantage for the simple construction of the cathode.

What is claimed is:

1. A method for manufacturing a workpiece using a magnetron sputter source comprising:

providing a round target body (1) whose front side has a sputter face;

placing a workpiece to be treated in a position facing the sputter face;

providing a magnet system (2, 3, 4, 5, 10, 11) comprising an inner pole (4) and an annular outer pole (3) annularly encompassing the inner pole (4), such that a magnetic field (B) develops over the sputter face in the form of a closed tunnel loop about a central source axis (6) of the magnetron sputter source;

rotatable supporting at least a portion of the magnet system (2, 3, 4, 5, 10, 11) about the source axis (6);

rotating the rotatable magnet system portion about the source axis (6) using driving means (30);

the annular outer pole (3) being disposed in a different plane from the plane of the inner pole (4), in a margin region around the round target body (1) and the annular outer pole (3) being elevated, the rotatable magnet system portion receiving the inner pole (4), which inner pole (4) is disposed eccentrically to the axis (6) and a second outer pole part (11) is disposed between the annular outer pole (3) and the inner pole (4) and on the rotatable magnet system portion; and with rotation of the rotatable magnet system portion, eccentrically sweeping a tunnel loop of the magnetic field (B) over the sputter face for manufacturing the workpiece.

2. The method as claimed in claim 1, wherein the magnet system (2, 3, 4, 5, 10, 11) comprises permanent magnets.

3. The method as claimed in claim 1, wherein the magnet system (2, 3, 4, 5, 10, 11) comprises a magnetic yoke (5, 10) of permeable material for a return of magnetic field lines of the tunnel loop of the magnetic field (B).

4. The method as claimed in claim 3, wherein the yoke (5, 10) is developed concentrically in two parts and comprises a first outer stationary part (5) and a second inner rotatably supported part (10).

5. The method as claimed in claim 4, wherein the second inner rotatably supported part (10) of the yoke receives the inner pole (4) and the second outer pole part (11).

6. The method as claimed in claim 1, wherein at least one of the poles (3, 4) and the pole part (11) comprises permanent-magnetic material.

7. The method as claimed in claim 1, wherein the closed tunnel loop of the magnet system is developed such that a directional characteristic thereof with respect to sputtered-off particles of the sputter face onto the workpiece, is substantially maintained constant during a sputter operation over the service life of the target body (1).

8. The method as claimed in claim 1, wherein the sputter face is at least in subregions developed concavely.

9. The method as claimed in claim 1, wherein, along the central source axis (6), a center mask (16) is provided, which penetrates the target body in the direction to a plane of a workpiece, and the mask is not electrically connected to the target body and forms a counter electrode to the target (1) or is disposed such that it is floating.

10. The method as claimed in claim 1, wherein the target body (1) encompasses annularly the central source axis (6), and the sputter face is developed concavely or is channel-shaped.

11. The method as claimed in claim 1, wherein the annular outer pole (3) is disposed in the region of the periphery of the target body (1) and the sputter face.

12. The method as claimed in claim 1, wherein a counter electrode (15) encompasses the target body (1) in a region of a periphery of the sputter face and forms a receiving opening (28) for receiving the workpiece.

13. The method as claimed in claim 1, wherein the greatest distance (d) between an original surface of the sputter face and a plane of a receiving opening (28) of the source for the workpiece, is in the range from 20 to 60 mm.

14. The method as claimed in claim 13, wherein the receiving opening (28) can receive the workpiece having a diameter of 50 to 150 mm.

15. The method as claimed in claim 13, wherein a diameter of the sputter face is greater than the diameter of the receiving opening (28).

16. The method as claimed in claim 13, wherein the target body (1) comprises metal or a metal alloy.

17. The method as claimed in claim 1, wherein the workpiece is a storage plate.

* * * * *